(12) United States Patent
Ianovitch

(10) Patent No.: US 6,461,971 B1
(45) Date of Patent: Oct. 8, 2002

(54) METHOD OF RESIDUAL RESIST REMOVAL AFTER ETCHING OF ALUMINUM ALLOY FILMSIN CHLORINE CONTAINING PLASMA

(75) Inventor: Serguei Ianovitch, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/489,497

(22) Filed: Jan. 21, 2000

(51) Int. Cl.[7] .............................................. H01L 21/302
(52) U.S. Cl. ...................... 438/710; 438/714; 134/1.2
(58) Field of Search .................. 134/1.1, 1.2; 510/175, 510/176; 430/313, 314, 315; 438/710, 714

(56) References Cited

U.S. PATENT DOCUMENTS

| | | | |
|---|---|---|---|
| 4,512,868 A | * 4/1985 | Fujimura et al. | 204/298 |
| 4,592,801 A | * 6/1986 | Hara et al. | 156/643 |
| 5,200,031 A | 4/1993 | Latchford et al. | 156/659.1 |
| 5,350,484 A | 9/1994 | Gardner et al. | 156/628 |
| 5,462,892 A | 10/1995 | Gabriel | 437/189 |
| 5,578,166 A | 11/1996 | Hirota | 156/643.1 |
| 5,683,857 A | 11/1997 | Shirai et al. | 430/326 |
| 5,792,672 A | 8/1998 | Chan et al. | 438/6 |
| 5,865,900 A | 2/1999 | Lee et al. | 134/12 |
| 5,886,410 A | * 3/1999 | Chiang et al. | 257/759 |
| 5,925,501 A | * 7/1999 | Zhang et al. | 430/313 |
| 6,027,995 A | * 2/2000 | Chiang et al. | 438/623 |

* cited by examiner

Primary Examiner—Benjamin L. Utech
Assistant Examiner—Kin-Chan Chen
(74) Attorney, Agent, or Firm—George O. Saile; Rosemary L.S. Pike; Stephen G. Stanton

(57) ABSTRACT

A method of removing remaining photoresist over an Al or Al alloy structure after etching the Al or Al alloy structure in chlorine based plasma, the Al or Al alloy structure being over a substrate, comprises the following steps. The photoresist, Al or Al alloy structure, and the substrate are treated in-situ with organic solvent vapors (such as acetone or carbon tetrachloride) in the absence of plasma excitation at a first predetermined temperature and pressure. The remaining photoresist is then removed with a plasma activated oxygen flow at a second predetermined temperature and pressure.

25 Claims, 1 Drawing Sheet

METHOD OF RESIDUAL RESIST REMOVAL AFTER ETCHING OF ALUMINUM ALLOY FILMSIN CHLORINE CONTAINING PLASMA

FIELD OF THE INVENTION

The present invention relates generally to dry semiconductor processing, and specifically to a method of residual resist removal after etching of aluminum or aluminum alloy films in chlorine containing plasma.

BACKGROUND OF THE INVENTION

Integrated circuit (IC) technology has advanced from large scale integration (LSI), to very large scale integration (VLSI), and to ultra-large scale integration (ULSI) due to the development of four basic cornerstones. Those four cornerstones are: (1) photo-masking processes; (2) layer formation processes; (3) doping processes; and (4) etching processes.

These four factors made it possible to incorporate into IC chips a lot on increasingly complex devices and circuits. On the other hand, they allowed the use of greater device densities and smaller minimum feature sizes and smaller isolation.

Nowadays, dry etching of metal films is the only available method because it can provide anisotropic etching of submicron features. For plasma etching of aluminum or aluminum alloy films, chlorine containing compounds are used because $AlCl_3$ is the most volatile compound among any other aluminum containing compounds.

However, there is one significant disadvantage of chlorine containing plasma etching of aluminum/aluminum alloy metal films. Residual $AlCl_3$ left on the side walls of the patterned structure or on resist surfaces produces $Al(OH)_3$ and HCl due to hydrolysis when exposed to water vapor, from air for example. This leads to corrosion of Al and Al alloy metal lines because Al and Al alloys are easily etched by chlorine containing acids, such as HCl.

A variety of methods have been created to prevent this corrosion, but it is still there. From the industrial semiconductor manufacturing point of view, such methods are supposed to be robust, effective, productive and inexpensive. Glow discharge plasma induction of oxygen, or its mixtures with nitrogen or noble gasses, are not effective.

U.S. Pat. No. 5,200,031 to Latchford et al. describes an in-situ stripping process for removing photoresist from an integrated circuit structure including the use of NH3. The Latchford et al. process can eliminate the concentration of corrosion responsible compounds, but can not prevent the corrosion.

U.S. Pat. No. 5,792,672 to Chan et al. describes an in-situ stripping process for removing a photoresist mask from an etched aluminum pattern including the use of $H_2O$. However the Chan et al. process likewise can eliminate concentration of by-products that lead to corrosion, but can not prevent the corrosion.

A fluorine containing plasma stripping gas mixture, i.e. $O_2+CF_4$, may be used, but it will attack any open silicon oxide areas leading to over-etch of the underlying dielectric.

U.S. Pat. No. 5,462,892 to Gabriel discloses a method of anticorrosion processing a semiconductor wafer to inhibit corrosion of aluminum or other metal interconnection lines. The Gabriel method heats the wafers post etch up to 450° C. to enhance desorbtion of $AlCl_3$ from the wafer surface. However heating the wafers up to 450° C. could cause changes in the mechanical and electrical features of the metal layout due to the recrystallization of the films that leads to a decrease in general reliability.

U.S. Pat. No. 5,578,166 to Hirota describes a copper or copper alloy reactive ion-etch (RIE) using a plasma of a gas mixture comprising a silicon tetrachloride ($SiCl_4$) gas, a nitrogen ($N_2$) gas, and a carbon compound gas that may typically be a carbon tetra-chloride ($CCl_4$), methane ($CH_4$), ethane ($C2H_6$) and so on. Hirota does not deal with aluminum etch.

U.S. Pat. No. 5,350,484 to Gardner et al. describes a method for anisotropically etching metal interconnects especially in the fabrication of ULSI, high aspect ratio interconnects. Ions are implanted into a region of the metal film to be etched, to form a converted layer of metal compounds in the region. The converted layer is then selectively etched and removed at low temperatures with an etchant (HCl, NH4OH, MeOH, ether, alcohol, acetone and water for a copper metal film) chosen to decrease etching of the metal film. Gardner et al. deals with wet processes which are not taken into account.

U.S. Pat. No. 5,683,857 to Shirai et al. describes a method of forming a resist coat in a dry developing treatment and stripping the resist coat using an organic vapor. Shirai et al. deals with mask development, not etching.

U.S. Pat. No. 5,865,900 to Lee et al. describes a method for removing a metal-fluoropolymer residue from an integrated circuit structure within an integrated circuit employing an aqueous acid solution followed by an organic solvent. Lee et al. is a conventional technique which follows after metal etch and dry resist strip.

SUMMARY OF THE INVENTION

Accordingly, it is an object of the present invention to eliminate corrosion of aluminum or aluminum alloys metal films created on the surface of semiconductor wafers using etching in chlorine containing plasma.

Another object of the present invention is to remove or minimize/eliminate the deleterious effects of $AlCl_3$ molecules in chlorine based plasma etching of aluminum or aluminum alloy metal films.

Other objects will appear hereinafter.

It has now been discovered that the above and other objects of the present invention may be accomplished in the following manner. Specifically, the remaining photoresist over an Al or Al alloy structure is removed after etching the Al or Al alloy structure in a chlorine based plasma. The Al or Al alloy structure being over a substrate. The Al or Al alloy structure, and the substrate are treated in-situ with organic solvent vapors (such as acetone or carbon tetrachloride) in the absence of plasma excitation at a first predetermined temperature and pressure. The remaining photoresist is then removed with a plasma activated oxygen flow at a second predetermined temperature and pressure.

BRIEF DESCRIPTION OF THE DRAWINGS

The features and advantages of the method of removing remaining photoresist after an Al or Al alloy structure etch in chloride based plasma according to the present invention will be more clearly understood from the following description taken in conjunction with the accompanying drawings in which like reference numerals designate similar or corresponding elements, regions and portions in which.

DETAILED DESCRIPTION OF THE PREFERRED EMBODIMENT

Unless otherwise specified, all processes and methods may accomplished by conventional methods known in the prior art.

The following table is a brief summary of the steps of the present invention:

---

Form patterned photoresist layer 30 over upper aluminum layer 20.
Etch aluminum layer 20 to lower substrate layer 10 in an etcher with a chlorine based plasma etch.
Move wafer 8 to stripping chamber.
STEP 1: Flow acetone or $CCl_4$ vapors into the stripping chamber to physically link with any adsorbed $AlCl_3$ molecules.
STEP 2: Flow oxygen plasma into the stripping chamber to flush the stripping chamber of: acetone or $CCl_4$; physically linked $AlCl_3$ molecules; and any physically linked chloride containing acids; and to form a protective oxidation film over the Al surface.

---

Figure 1:
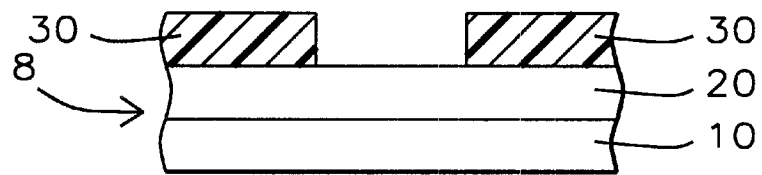
FIGS. 1 through 4 schematically illustrate in cross-sectional representation the preferred embodiment of the present invention.

As shown in FIGS. 1, the process of the invention is utilized on an integrated circuit structure, or wafer, 8 upon which a substrate layer 10, and an overlying aluminum (Al) or aluminum alloy (Al alloy) metal layer, or composite of metal layers, 20 have been previously deposited.

Substrate layer 10 can represent a wafer with layers overlying it. Preferably the top layer overlying the wafer is preferably comprised of different dielectric layers including $SiO_2$, PSG, BPSG, USG or FSG. The aluminum alloy of layer 20 may comprise AlSi, AlCu, AlCuSi, SlCuTi, or AlTi. Photoresist mask 30 exposed a portion of underlying Al/Al alloy layer 20.

Figure 2:
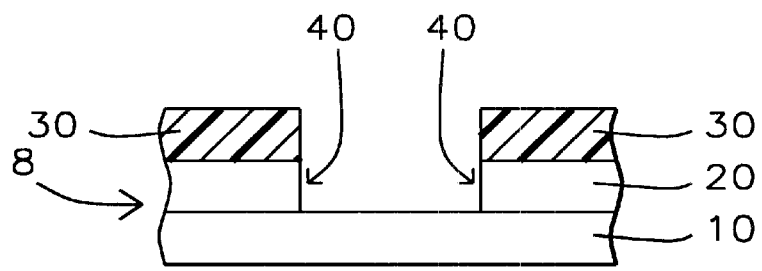

As shown in FIG. 2, the exposed portion of Al/Al alloy layer 20 in FIG. 1 is etched, preferably with a chloride containing plasma, creating a trench with exposed side walls 40.

Because of the chlorine containing plasma, aluminum tri-chloride ($AlCl_3$) is the main product of the reaction between the plasma and the aluminum or aluminum alloy metal layer 20. The $AlCl_3$ adsorbs at the surface of the resist mask 30 and side walls 40 of the etched structure. If not removed the $AlCl_3$ will corrode the Al/Al alloy metal layer 20 when exposed to $H_2O$, such as water vapor in the ambient air by the formation of chloride containing acids such as hydrochloric acid HCl:

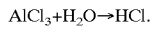

$$AlCl_3 + H_2O \rightarrow HCl.$$

In accordance with the present invention, the $AlCl_3$ is detached from the surface of the Al/Al alloy layer 20 during acetone or $CCl_4$ adsorbtion on wafer 8 because adsorbed acetone or $CCl_4$ creates a continuous film of solvent which allows $AlCl_3$ to move along the wafer surface.

As noted above, metal layer or composite of metal layers 20 may comprise Al or Al alloys, such as AlCu, AlSiCu, AlCuTi, or AlTi. Layer 20 may also be comprised of the above metals with a barrier metal partially surrounding it. The barrier metals may be comprised of compounds such as Ti, Ta, TiN, TaN, TiW and multilayer barrier compositions such as Ti covered with TiN, or Ta covered with TaN. The Al alloys may have the following atomic percentages of:

Si→0 to 2% atomic;

Ti→0 to 2% atomic; and

Cu→0 to 4% atomic.

The present invention is admirably suited for uppermost Al or Al alloy metal layer structures. The term "aluminum" or "Al" will hereinafter include aluminum (Al) and aluminum alloys (Al alloys). The wafer (integrated circuit structure 8) is removed from the metal etch chamber and is placed in a stripping chamber (unless a single chamber is used for both processes). The preferable pressure ranges at which the stripping chamber may be maintained for the first and second stripping steps are noted below.

The temperature of the wafer emerging from the etching chamber is about 100° C. During the subsequent stripping process the temperature may be maintained from about 0 to 300° C. with more detailed preferably temperature ranges for the first and second stripping steps as noted below. As necessary, the temperature of the wafer is ramped up to the stripping process temperature at the rate of about 10° C./second or down to the stripping process temperature at the rate of about 10° C./second.

The object of the stripping process is to detach any adsorbed $AlCl_3$ from the surface of the aluminum film.

First Stripping Step

Figure 3:
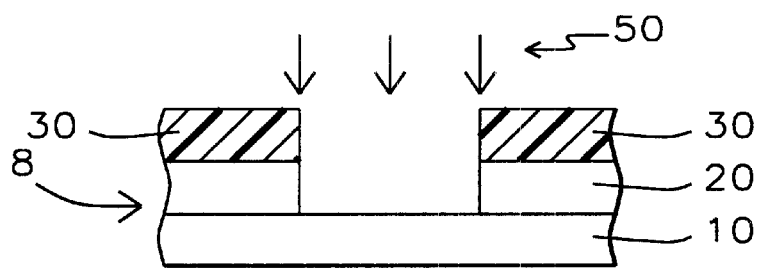

As shown in FIG. 3, during the first stripping step, either acetone ($CH_3COCH_3$) or carbon tetrachloride ($CCl_4$) vapors 50 are introduced into the stripping chamber at a rate equivalent to: at least about 500 sccm (standard cubic centimeters per minute), and preferably about 5000 sccm acetone into a 5 liter chamber (this is an example only as different equipment may have a different volume of stripchamber) for about 3 to 10 seconds and more preferably from about 4 to 6 seconds.

The acetone or $CCl_4$ in-situ vapor first step treatment is conducted without discharge, i.e. without plasma activation of the selected vapor. The temperature is preferably maintained from about 0 to 300° C., and more preferably from about 20 to 100° C. The pressure is preferably from about 0.1 to 700 Torr, and more preferably from about 100 to 500 Torr.

It is believed that when exposed to either the acetone or $CCl_4$ vapors, any $AlCl_3$ adsorbed on the surface of the aluminum film 40 forms physical links with the acetone or $CCl_4$ molecules in a manner akin to being dissolved by the acetone or $CCl_4$. The physical links between the adsorbed $AlCl_3$ molecules and the acetone or $CCl_4$ loosens the connection/attraction of the adsorbed $AlCl_3$ to the aluminum surface of the aluminum film 20.

The adsorbed acetone or $CCl_4$ covers the wafer surface with a continuous film. The $AlCl_3$ linked with surrounding acetone or $CCl_4$ molecules could slide along the wafer surface covered by the adsorbed acetone or $CCl_4$ molecules. As the $AlCl_3$ lose links with the wafer surface, the $AlCl_3$ can be easily pumped out and away from the wafer surface during the subsequent photoresist removal.

Even if conditions would then arise which would lead to the reaction of $AlCl_3$ and $H_2O$ (such as exposure to water vapor in air) to form a chlorine containing acid (such as HCl) it is believed that:

a) additional amounts of $AlCl_3$ will be removed by pumping during the oxygen base photoresist strip;

b) any $AlCl_3$ detached from the surface of aluminum layer 20 will be easily oxidized, i.e.

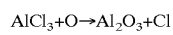

$$AlCl_3 + O \rightarrow Al_2O_3 + Cl$$

and the Cl will be pumped out; and c) as $AlCl_3$ is detached from the surface of aluminum layer 20, the Al will be oxidized with oxygen and a protective $Al_2O_3$ layer will be formed on the surface of layer 20.

A further advantage of using acetone in the first stripping step is that the acetone 50 can cause restructuring of the resist polymer, such as $(-C_xH_yCl_x-)_n$, that will facilitate removal of the remaining resist polymer in the second stripping step.

The first stripping step of the present invention is carried out for a period of time from about 10 to 120 seconds, and more preferably for a period of time from about 20 to 40 seconds.

Second Stripping Step

Figure 4:
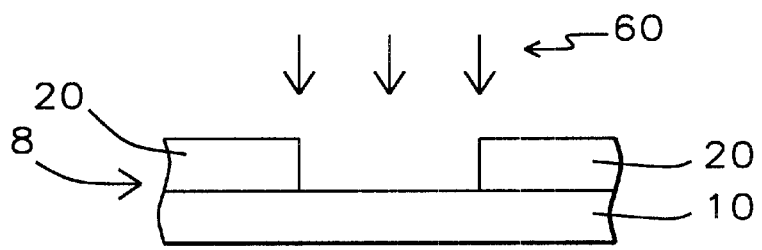

As shown in FIG. 4, during the second stripping step of the present invention, an oxygen plasma 60 is introduced into the stripping chamber to:

- remove the remaining resist polymer 30 and flush it from the stripping chamber;
- flush the remaining acetone or $CCl_4$ from the stripping chamber;
- flush any remaining $AlCl_3$ molecules from the stripping chamber; and form a protective oxidation film over the Al surface.

Any process could be applied such as that disclosed in U.S. Pat. No. 5,200,031 and U.S. Pat. No. 5,792,672.

The oxygen plasma may be generated by any conventional plasma generator and is preferably generated in a microwave plasma generator downstream from the stripping chamber. For example a Model ASP chamber manufactured by Applied Materials (of Santa Clara, Calif., U.S.A.) used together with DPS systems.

The oxygen flow is introduced into the stripping chamber at a rate equivalent to: from about 50 to 5000 sccm, and preferably about 3500 sccm acetone into a 5 liter chamber (this is an example only as different equipment may have a different volume of strip-chamber). The total RF power applied to the oxygen flow is from about 100 W to 3000 W, and more preferably from about 1300 to 1700 W.

The pressure within the stripping chamber is maintained at from about 0.1 to 10 Torr, more preferably from about 2.0 to 10 Torr, and most preferably from about 1 to 5 Torr. The temperature of the wafer 8 is maintained from about 0 to 300° C., more preferably from about 200 to 280° C., and most preferably about 250° C.

The oxygen plasma 60 is flowed through the stripping chamber for a period of about at least 30 seconds, more preferably 60 seconds. As noted above, the stripping chamber pressure and the wafer temperature may remain the same as during the first stripping step.

Any remaining resist polymer, acetone or $CCl_4$, and $AlCl_3$ or chlorine containing acid that may have formed, are removed from the wafer 8 and the stripping chamber in the oxygen plasma stream.

After the desired second stripping step time period, the oxygen plasma is then ceased and the flow of oxygen gas is stopped. The wafer 8 may then be removed from the stripping chamber and subject to further processing.

While particular embodiments of the present invention have been illustrated and described, it is not intended to limit the invention, except as defined by the following claims.

We claim:

1. A method of removing photoresist over an Al or Al alloy structure, comprising the steps of:
    providing an Al or Al alloy structure over a substrate;
    forming a patterned photoresist layer over the Al or Al alloy structure;
    etching the Al or Al alloy structure with a chlorine based plasma using the patterned photoresist layer as a mask;
    treating the patterned photoresist layer, Al or Al alloy structure, and the substrate in-situ with organic solvent vapors in the absence of plasma excitation at a first temperature and pressure; whereby molecules of the organic solvent vapors are adsorbed at least on the surface of the Al or Al alloy structure and link with any $AlCl_3$ formed during the etching of the Al or Al alloy structure; and
    then removing said treated patterned photoresist layer with a plasma activated oxygen flow at a second temperature and pressure whereby the linkage of the formed $AlCl_3$ with the organic solvent vapors molecules on the surface of the Al or Al alloy structure facilitates removal of the formed $AlCl_3$.

2. The method of claim 1, wherein said first temperature is from 0 to 300° C. and said first pressure is from about 0.1 to 700 Torr.

3. The method of claim 1, wherein said first temperature is from about 20 to 100° C. and said first pressure is from about 100 to 500 Torr.

4. The method of claim 1, wherein said second temperature is from about 0 to 300° C. and said second pressure is from about 0.1 to 10 Torr.

5. The method of claim 1, wherein said second temperature is from about 220 to 260° C. and said second pressure is from about 1 to 5 Torr.

6. The method of claim 1, wherein said oxygen plasma is generated in a microwave downstream plasma generator by purging molecular oxygen through said plasma generator.

7. The method of claim 1, wherein the total RF power applied to said oxygen flow is from about 100 W to 300 W.

8. The method of claim 1, wherein said oxygen plasma is generated in a microwave downstream plasma generator and the total RF power applied to the oxygen flow is from about 100 W to 3000 W.

9. The method of claim 1, wherein said oxygen plasma is generated in a microwave downstream plasma generator; the total RF power applied to the oxygen flow is from about 100 W to 3000 W; said first and second temperatures are from about 0 to 300° C., said first pressure is from about 0.1 to 700 Torr, and said second pressure is from about 0.1 to 10 Torr.

10. The method of claim 1, wherein: said oxygen plasma is generated in a microwave downstream plasma generator; the total RF power applied to the oxygen flow is from about 1300 W to 1700 W; said first temperature is from about 20 to 100° C., said second temperature is from about 220 to 260° C., said first pressure is from about 100 to 500 Torr, and said second pressure is from about 1 to 5 Torr.

11. The method of claim 1, wherein said organic solvent vapors are selected from the group consisting of acetone and carbon tetrachloride.

12. A method of removing photoresist over an Al or Al alloy structure, comprising the steps of:
    providing an Al or Al alloy structure over a substrate;
    forming a patterned photoresist layer over the Al or Al alloy structure;
    etching the Al or Al alloy structure with a chlorine based plasma using the patterned photoresist layer as a mask;
    treating the patterned photoresist layer, Al or Al alloy structure, and the substrate in-situ with organic solvent vapors in the absence of plasma excitation at a first temperature and pressure; whereby molecules of the organic solvent vapors are adsorbed at least on the surface of the Al or Al alloy structure and link with any $AlCl_3$ formed during the etching of the Al or Al alloy structure; and
    then removing said treated patterned photoresist layer with a oxygen plasma flow generated in a microwave downstream plasma generator by purging molecular oxygen through said plasma generator at a second temperature and pressure whereby the linkage of the formed $AlCl_3$ with the organic solvent vapors molecules on the surface of the Al or Al alloy structure facilitates removal of the formed $AlCl_3$.

13. The method of claim 12, wherein said first temperature is from about 0 to 300° C. and said first pressure is from about 0.1 to 700 Torr.

14. The method of claim 12, wherein said first temperature is from about 20 to 100° C. and said first pressure is from about 100 to 500 Torr.

15. The method of claim 12, wherein said second temperature is from about 0 to 300° C. and said second pressure is from about 0.1 to 10 Torr.

16. The method of claim 12, wherein said second temperature is from about 220 to 260° C. and second pressure is from about 1 to 5 Torr.

17. The method of claim 12, wherein the total RF power applied to said oxygen flow is from about 100 W to 3000 W.

18. The method of claim 12, wherein: the total RF power applied to the oxygen flow is from about 100 W to 3000 W; said first and second temperatures are from about 0 to 300° C., said first pressure is from about 0.1 to 700 Torr, and said second pressure is from about 0.1 to 10 Torr.

19. The method of claim 12, wherein: the total RF power applied to the oxygen flow is from about 1300 W to 1700 W; said first temperature is from about 20 to 100° C., said second temperature is from about 200 to 260° C., said first pressure is from about 100 to 500 Torr, and said second pressure is from about 1 to 5 Torr.

20. The method of claim 12, wherein said organic solvent vapors are selected from the group consisting of acetone and carbon said second pressure is from about 1 to 5 Torr.

21. A method of removing photoresist over an Al or Al alloy structure, comprising the steps of:

providing an Al or Al alloy structure over a substrate;

forming a patterned photoresist layer over the Al or Al alloy structure;

etching the Al or Al alloy structure with a chlorine based plasma using the patterned photoresist layer as a mask;

treating the patterned photoresist layer, Al or Al alloy structure, and the substrate in-situ with organic solvent vapors in the absence of plasma excitation at a first temperature of from about 0 to 300° C. and a first pressure of from about 0.1 to 700 Torr; whereby molecules of the organic solvent vapors are adsorbed at least on the surface of the Al or Al alloy structure and link with any $AlCl_3$ formed during the etching of the Al or Al alloy structure; and then removing said treated patterned photoresist layer with a plasma activated oxygen flow at a second temperature of from about 0 to 300° C. and a second pressure of from about 0.1 to 10 Torr; wherein said oxygen plasma is generated in a microwave downstream plasma generator with a total RF power applied to said oxygen flow of from about 100 W to 3000 W whereby the linkage of the formed $AlCl_3$ with the organic solvent vapors molecules on the surface of the Al or Al alloy structure facilitates removal of the formed $AlCl_3$.

22. The method of claim 21, wherein said first temperature is from about 20 to 100° C. and said first pressure is from about 100 to 500 Torr.

23. The method of claim 21, wherein said second temperature is from about 220 to 260° C. and said second pressure is from about 1 to 5 Torr.

24. The method of claim 21, wherein said total RF power applied to said oxygen flow of from about 1300 W to 1700 W.

25. The method of claim 21, wherein said organic solvent vapors are selected from the group consisting of acetone and carbon tetrachloride.

* * * * *

UNITED STATES PATENT AND TRADEMARK OFFICE
CERTIFICATE OF CORRECTION

PATENT NO.    : 6,461,971 B1
DATED         : October 8, 2002
INVENTOR(S)   : Serguei Ianovitch It is certified that error appears in the above-identified patent and that said Letters Patent is hereby corrected as shown below:

Title page,
Item [54], the title should read -- METHOD OF RESIDUAL RESIST REMOVAL AFTER ETCHING OF ALUMINUM OR ALUMINUM ALLOY FILMS IN CHLORINE CONTAINING PLASMA --.

Signed and Sealed this

Twenty-fifth Day of February, 2003

JAMES E. ROGAN
*Director of the United States Patent and Trademark Office*